United States Patent
Yamamoto et al.

(10) Patent No.: US 7,667,377 B2
(45) Date of Patent: Feb. 23, 2010

(54) LAMINATED PIEZOELECTRIC ELEMENT AND PROCESS FOR PRODUCING THE SAME

(75) Inventors: Atsushi Yamamoto, Yasu (JP); Yoichi Deguchi, Yasu (JP); Koichi Hayashi, Kusatsu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/131,371

(22) Filed: Jun. 2, 2008

(65) Prior Publication Data

US 2008/0231147 A1    Sep. 25, 2008

Related U.S. Application Data

(63) Continuation of application No. PCT/JP2006/320398, filed on Oct. 12, 2006.

(30) Foreign Application Priority Data

Dec. 8, 2005    (JP)    ............... 2005-354332

(51) Int. Cl.
    *H01L 41/08*    (2006.01)
(52) U.S. Cl. .................. 310/358; 252/62.9 PZ
(58) Field of Classification Search ............. 310/358, 310/363; 252/62.9 PZ
    See application file for complete search history.

(56) References Cited

U.S. PATENT DOCUMENTS

| 4,816,239 | A * | 3/1989 | Wada et al. ............... 423/280 |
| 7,344,654 | B2 * | 3/2008 | Ogiso et al. .......... 252/62.9 PZ |
| 7,498,725 | B2 * | 3/2009 | Iezumi et al. ............. 310/358 |
| 7,528,531 | B2 * | 5/2009 | Iezumi et al. ............. 310/358 |
| 7,531,947 | B2 * | 5/2009 | Shindo et al. ............. 310/363 |
| 2002/0098333 | A1 | 7/2002 | Feltz et al. |
| 2005/0212388 | A1 | 9/2005 | Nanao et al. |
| 2008/0074004 | A1 | 3/2008 | Yamamoto et al. |

FOREIGN PATENT DOCUMENTS

| JP | 7-257924 | 10/1995 |
| JP | 2000-169223 | 6/2000 |
| JP | 2001-089237 | 4/2001 |

(Continued)

OTHER PUBLICATIONS

PCT/JP2005/000655 International Search Report dated Mar. 1, 2005.

*Primary Examiner*—Mark Budd
(74) *Attorney, Agent, or Firm*—Dickstein Shapiro LLP (57) ABSTRACT

A multilayer piezoelectric device including a body having internal electrode layers and piezoelectric ceramic layers alternately stacked. The internal electrode layers contain Cu as a major component, the piezoelectric ceramic layers contain a compound oxide represented by $Pb(Ti, Zr)O_3$ as a major component, and a metal oxide ($Nb_2O_5$, $Sb_2O_5$, $Ta_2O_5$, or $WO_3$) containing Nb, Sb, Ta, or W, which is at least one of a pentavalent metal element and a hexavalent metal element, is incorporated in the piezoelectric ceramic layers such that the concentration of the metal oxide decreases with distance from the internal electrode layers. Thereby, even in a case where internal electrodes contain Cu as a major component, it is possible to provide a multilayer piezoelectric device which can be obtained by low-temperature firing while ensuring a sufficient piezoelectric constant.

9 Claims, 2 Drawing Sheets

FOREIGN PATENT DOCUMENTS

| | | |
|---|---|---|
| JP | 2001-250994 | 9/2001 |
| JP | 2002-261343 | 9/2002 |
| JP | 2004-336981 | 11/2004 |
| JP | 2005-85937 | 3/2005 |
| JP | 2005-212388 | 8/2005 |
| JP | 2006-96626 | 4/2006 |
| JP | 2006-156586 | 6/2006 |
| WO | WO-2005-071769 | 8/2005 |

* cited by examiner

LAMINATED PIEZOELECTRIC ELEMENT AND PROCESS FOR PRODUCING THE SAME

CROSS REFERENCE TO RELATED APPLICATIONS

The present application is a continuation of International Application No. PCT/JP2006/320398, filed Oct. 12, 2006, which claims priority to Japanese Patent Application No. JP2005-354332, filed Dec. 8, 2005, the entire contents of each of these applications being incorporated herein by reference in their entirety.

FIELD OF THE INVENTION

The present invention relates to a multilayer piezoelectric device, such as a piezoelectric actuator, a piezoelectric resonator, or a piezoelectric filter, and a method for manufacturing the multilayer piezoelectric device.

BACKGROUND OF THE INVENTION

PZT-based piezoelectric ceramics containing $Pb(Ti, Zr)O_3$ (hereinafter referred to as "PZT") as a major component are widely known as typical piezoelectric ceramics used for multilayer piezoelectric devices, such as piezoelectric actuators, piezoelectric resonators, and piezoelectric filters.

Furthermore, as multilayer piezoelectric devices including PZT-based piezoelectric ceramics, devices which are fabricated by alternately stacking internal electrode layers composed of an Ag—Pd alloy and ceramic layers composed of a PZT-based piezoelectric ceramic, followed by simultaneous firing, are often used. However, since Pd is expensive, research and development has been actively carried out on multilayer piezoelectric devices in which inexpensive Cu is used as the material for internal electrodes.

For example, Patent Document 1 describes a multilayer piezoelectric device including internal electrode layers containing Cu as a major component, and a PZT-based piezoelectric ceramic.

Patent Document 1 discloses a multilayer piezoelectric device including electrodes containing Cu as a major component, and a piezoelectric ceramic, in which the piezoelectric ceramic contains, as a major component, a perovskite oxide represented by general formula $ABO_3$, the A site including Pb, the B site including Zr and Ti, wherein the B site includes an acceptor element which is a divalent metal element and a donor element which is a pentavalent metal element, and the relationship $0.42<a/b<0.5$ is satisfied, wherein a represents the total molar amount of the acceptor element, and b represents the total molar amount of the donor element.

When the electrodes containing Cu as the major component and the piezoelectric ceramic are simultaneously fired, Cu in the electrodes diffuses into the piezoelectric ceramic and acts as a divalent acceptor element in the state of $Cu^{2+}$. Consequently, in the multilayer piezoelectric device of Patent Document 1, in the B site of the piezoelectric ceramic composition, the donor content is adjusted to be in excess so that the relationship $0.42<a/b<0.5$ is satisfied, wherein a represents the total molar amount of the acceptor element, and b represents the total molar amount of the donor element. Thereby, the decrease in the average valence in the B site due to the diffusion of Cu is cancelled out, enabling prevention of a decrease in the piezoelectric constant.

Patent Document 1: International Publication No. WO2005/071769 pamphlet

SUMMARY OF THE INVENTION

In the multilayer piezoelectric device described in Patent Document 1, by adjusting the donor content to be in excess in the B site of the PZT-based piezoelectric ceramic, even when the internal electrodes contain Cu as the major component, it is possible to obtain a piezoelectric constant substantially equivalent to that in the case where internal electrodes are composed of an Ag—Pd alloy.

However, when the B site is set so that the donor content is in excess, sinterability decreases. Consequently, it is necessary to perform firing at relatively high temperatures. For example, in the multilayer piezoelectric device of Patent Document 1, the firing temperature is set at 1,000° C. (refer to paragraph [0048], Patent Document 1).

On the other hand, the melting point of Cu is about 1,050° C. Since the firing temperature of 1,000° C. is close to the melting point of Cu, it is desirable to further decrease the firing temperature. Moreover, if the firing temperature is decreased, it is considered that the amount of diffusion of Cu can be reduced. From such a standpoint, it is also desirable to decrease the firing temperature. Furthermore, if the firing temperature is decreased, the energy required for firing can be reduced. Thus, fuel and electric power can be saved, and also the manufacturing cost can be reduced.

The present invention has been achieved under these circumstances. It is an object of the invention to provide a multilayer piezoelectric device which can be obtained by low-temperature firing while ensuring a sufficient piezoelectric constant even in the case where internal electrodes contain Cu as a major component, and a method for manufacturing the multilayer piezoelectric device.

As a result of diligent studies conducted by the present inventors to achieve the object described above, it has been found that by incorporating a metal oxide in a piezoelectric ceramic such that the concentration of the metal oxide decreases with distance from internal electrode layers, it is possible to charge-compensate for the decrease in the average valence in the B site of the piezoelectric ceramic composition due to the diffusion of Cu, and thereby it is possible to obtain a satisfactory piezoelectric constant even if the donor content is not adjusted to be in excess in the B site of the piezoelectric ceramic. Moreover, since it is not necessary to set the donor content to be in excess, sinterability can be improved, and a desired multilayer piezoelectric device can be obtained by low-temperature firing.

That is, a multilayer piezoelectric device according to the present invention is characterized by including a body in which internal electrode layers and piezoelectric ceramic layers are alternately stacked, wherein the internal electrode layers contain Cu as a major component, the piezoelectric ceramic layers contain a compound oxide represented by $Pb(Ti, Zr)O_3$ as a major component, and a metal oxide containing at least one of a pentavalent metal element and a hexavalent metal element is incorporated in the piezoelectric ceramic layers such that the concentration of the metal oxide decreases with distance from the internal electrode layers.

The multilayer piezoelectric device of the present invention is also characterized in that the metal element is at least one selected from the group consisting of Nb, Sb, Ta, and W.

Furthermore, a method for manufacturing a multilayer piezoelectric device according to the present invention is characterized by including a stacking step of alternately stacking internal electrode patterns and piezoelectric ceramic green sheets to form a laminate, and a firing step of firing the laminate to form a body in which internal electrode layers and piezoelectric ceramic layers are alternately stacked, wherein the piezoelectric ceramic green sheets contain a compound oxide represented by Pb(Ti, Zr)O$_3$ as a major component; the internal electrode patterns contain a conductive powder containing Cu and at least one of a pentavalent metal element and a hexavalent metal element; and in the firing step, the metal element is diffused in the form of a metal oxide from the internal electrode layers into the piezoelectric ceramic layers such that the concentration of the metal oxide decreases with distance from the internal electrode layers.

The method for manufacturing the multilayer piezoelectric device of the present invention is also characterized in that the metal element is at least one selected from the group consisting of Nb, Sb, Ta, and W.

The method for manufacturing the multilayer piezoelectric device of the present invention is also characterized in that the metal oxide is represented by any one of Nb$_2$O$_5$, Sb$_2$O$_5$, Ta$_2$O$_5$, and WO$_3$.

The method for manufacturing the multilayer piezoelectric device of the present invention is also characterized in that the content of the metal oxide is less than 40.0% by weight on the basis of the total content of the conductive powder and the metal oxide.

According to the multilayer piezoelectric device of the present invention, a metal oxide containing at least one of a pentavalent metal element and a hexavalent metal element (Nb, Sb, Ta, W, or the like) is incorporated in the piezoelectric ceramic layers such that the concentration of the metal oxide decreases with distance from the internal electrode layers. Consequently, the decrease in the average valence due to the diffusion of Cu can be charge-compensated for by the metal oxide, and thereby it is possible to obtain a good piezoelectric constant even if the donor content is not adjusted to be in excess to perform charge compensation. Furthermore, since it is not necessary to set the B site so that the donor content is in excess, sinterability can be improved, and firing can be performed at lower temperatures. Moreover, in the vicinity of the internal electrodes where the decrease in the average valence due to the diffusion of Cu is large, charge compensation can be effectively performed by the metal oxide. Meanwhile, in locations distant from the internal electrode layers where the decrease in the average valence due to the diffusion of Cu is not very large, since the concentration of the metal oxide is low, the metal oxide is not diffused excessively into the piezoelectric ceramic layers. Thereby, it is also possible to suppress the decrease in sinterability, thus being favorable to low-temperature firing.

Furthermore, according to the method for manufacturing the multilayer piezoelectric device of the present invention, the internal electrode patterns contain a conductive powder containing Cu and at least one of a pentavalent metal element and a hexavalent metal element (Nb, Sb, Ta, W, or the like), and in the firing step, the metal element is diffused, in the form of a metal oxide, such as Nb$_2$O$_5$, Sb$_2$O$_5$, Ta$_2$O$_5$, or WO$_3$, from the internal electrode layers into the piezoelectric ceramic layers such that the concentration decreases with distance from the internal electrode layers. Consequently, a concentration gradient of the metal oxide is formed in the piezoelectric ceramic layers. Therefore, it is possible to easily fabricate a multilayer piezoelectric device in which the concentration of a metal oxide decreases with distance from internal electrode layers in piezoelectric layers, and it is possible to fabricate a multilayer piezoelectric device in which a satisfactory piezoelectric constant can be obtained even if firing is performed at low temperatures.

Furthermore, since the content of the metal oxide is less than 40.0% by weight on the basis of the total content of the conductive powder and the metal oxide, the connectivity between the internal electrode layers and external electrodes is not decreased. Thus, it is possible to obtain a high-quality multilayer piezoelectric device with high reliability.

REFERENCE NUMERALS 10 body
11 piezoelectric ceramic layer
21, 22 internal electrode layer

DETAILED DESCRIPTION OF THE INVENTION

Figure 1:
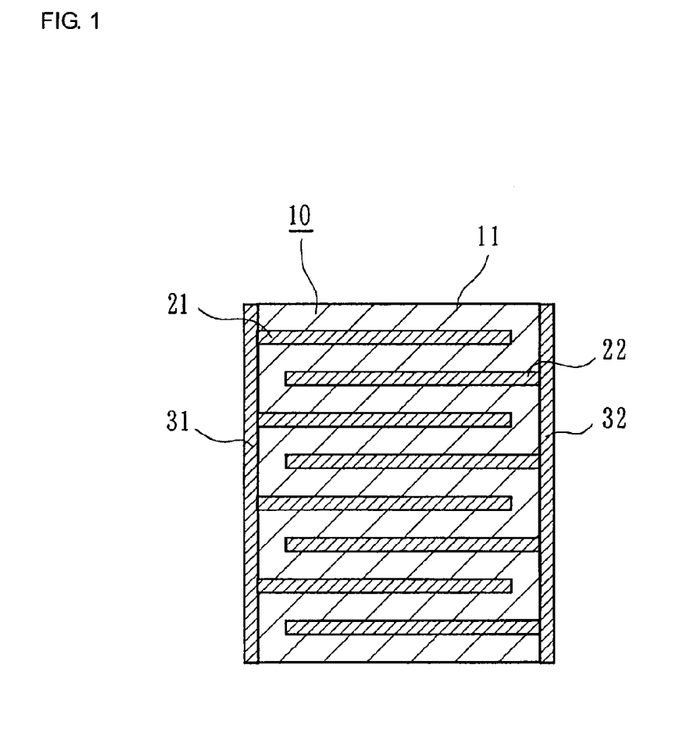
FIG. 1 is a cross-sectional view showing a multilayer piezoelectric device of the present invention.

Best modes for carrying out the present invention will now be described with reference to the accompanying drawings. FIG. 1 is a cross-sectional view showing a multilayer piezoelectric device according to an embodiment of the present invention.

The multilayer piezoelectric device includes a body 10 in which piezoelectric ceramic layers 11 and internal electrode layers 21 and 22 are alternately stacked, and external electrodes 31 and 32 disposed on the surface of the body 10. The internal electrode layers 21 connected to the external electrode 31 and the internal electrode layers 22 connected to the other external electrode 32 are alternately arranged. In the multilayer piezoelectric device, when a voltage is applied between the external electrodes 31 and 32, an electric field is generated between each pair of internal electrode layers 21 and 22, and the piezoelectric ceramic layers 11 expand or contract.

The internal electrode layers 21 and 22 contain a conductive powder containing Cu as a major component, and a metal oxide containing at least one of a pentavalent metal element and a hexavalent metal element. Here, as the pentavalent metal element, Nb, Sb, or Ta can be used, and as the hexavalent metal element, W (tungsten) can be used. Consequently, the metal oxide is contained, for example, in the form of Nb$_2$O$_5$, Sb$_2$O$_5$, Ta$_2$O$_5$, or WO$_3$, in the internal electrode layers 21 and 22.

As described above, the internal electrode layers 21 and 22 contain the conductive powder containing Cu as the major component, and preferably, the conductive powder contains Ni as a minor component. The melting point of Cu is 1,050° C., while the melting point of Ni is high at 1,450° C. Therefore, by incorporation of Ni, the melting point of the internal electrode layers 21 and 22 is increased and the diffusion of Cu is inhibited. Moreover, since Ni is more easily oxidized than Cu, the oxidation of Cu is inhibited, and thus the diffusion of Cu is also inhibited. Furthermore, when Ni is contained as the minor component, the ratio of Cu content to Ni content, in terms of weight, is preferably 85:15 to 70:30. The reason for this is that when the Ni content is 15% by weight or more, the effect of inhibiting the oxidation and diffusion of Cu is high, and the decrease in the piezoelectric constant due to the diffusion of Cu can be effectively inhibited. However, if the Ni content exceeds 30% by weight, the Cu content decreases excessively, and there is a possibility that the internal electrode layers 21 and 22 may be disconnected, which is unfavorable.

When Ni is contained in the internal electrode layers 21 and 22, Ni is mostly present as NiO. When Ni is incorporated in the internal electrode layers 21 and 22, preferably, Ni is also incorporated in the composition of the piezoelectric ceramic layers 11. The reason for this is that by incorporating Ni in the composition of the piezoelectric ceramic layers 11, it is possible to inhibit NiO from diffusing from the internal electrode layers 21 and 22 into the piezoelectric ceramic layers 11.

In addition to the case where the piezoelectric ceramic layers 11 contain a PZT-based compound oxide having a perovskite structure represented by general formula $ABO_3$ as a major component and are composed of PZT(Pb(Ti, Zr)$O_3$) alone, the piezoelectric ceramic layers 11 may have a composition in which another perovskite compound oxide, such as Pb(Ni, Nb)$O_3$ or Pb(Zn, Nb)$O_3$, is allowed to form solid solutions with PZT, and thus the B site is partially replaced by Ni, Nb, Zn, or the like.

Furthermore, the PZT-based compound oxide may have a composition in which the B site is partially replaced by any of various combinations of cations, such as a combination of a monovalent cation and a pentavalent cation, a combination of a divalent cation and a pentavalent cation, a combination of a trivalent cation and a pentavalent cation, or a combination of a trivalent cation and a hexavalent cation. Here, as the monovalent cation, Na or K can be used, and as the divalent cation, Ni, Zn, Co, Mg, Mn, Fe, Cr, or Cu can be used. Furthermore, as the trivalent cation, Fe, In, Sc, or Yb can be used, and as the pentavalent cation, Nb, Sb, Ta, or V can be used. Furthermore, as the hexavalent cation, W or the like can be used.

The average valence in the B site is preferably set at 4 or a value in the vicinity of 4, and specifically in a range of 3.95 to 4.05. The reason for this is that if the average valence in the B site is less than 3.95, there is a possibility that piezoelectricity may be decreased due to the excessive diffusion of CuO from the internal electrode side. On the other hand, if the average valence exceeds 4.05, there is a possibility that sinterability may be decreased, and it may become difficult to perform firing at low temperatures.

Furthermore, as necessary, Pb constituting the A site of the PZT-based compound oxide may be partially replaced by Ba, Sr, or Ca, which is a divalent cation, or La, Y, Bi, or Nd, which is a trivalent cation. In such a case, the replacement ratio by these elements is preferably 5 mole percent or less. The reason for this is that if the replacement ratio exceeds 5 mole percent, there is a possibility that sinterability may be decreased.

The average valence in the A site is preferably set at 2 or a value in the vicinity of 2, and specifically in a range of 1.94 to 2.05. The reason for this is that if the average valence in the A site is less than 1.94 or more than 2.05, there is a possibility that sinterability may be decreased, and it may become difficult to perform firing at low temperatures.

The piezoelectric ceramic layers 11 contain a metal oxide containing a pentavalent or hexavalent metal element, and the concentration of the metal oxide is high in the vicinity of the internal electrode layers 21 and 22 and decreases with distance from the internal electrode layers 21 and 22. Such a structure is formed by allowing the metal oxide, such as $Nb_2O_5$, $Sb_2O_5$, $Ta_2O_5$, or $WO_3$, contained in the internal electrode layers 21 and 22 to diffuse from the internal electrodes 21 and 22 into the piezoelectric ceramic layers 11 during the firing process. By setting the concentration of the metal oxide containing a pentavalent or hexavalent metal element so as to decrease with distance from the internal electrode layers 21 and 22 as described above, charge compensation can be performed by the pentavalent or hexavalent metal oxide even if the content of the donor element in the piezoelectric ceramic layers 11 is not adjusted to be in stoichiometric excess (donor content being in excess) to compensate for the decrease in the average valence in the B site due to the diffusion of Cu.

By charge-compensating for the decrease in the average valence of the B site due to the diffusion of Cu by use of the metal oxide as described above, it is not necessary to perform charge compensation by setting the donor content to be in excess, and it is possible to obtain a multilayer piezoelectric device having a sufficient piezoelectric constant by low-temperature firing. Moreover, in the vicinity of the internal electrodes 21 and 22 where the decrease in the average valence due to the diffusion of Cu is large, charge compensation can be effectively performed. Meanwhile, in locations distant from the internal electrode layers 21 and 22 where the decrease in the average valence due to the diffusion of Cu is not very large, since the pentavalent or hexavalent metal oxide is not present in an amount more than necessary, it is not necessary to increase the content of the pentavalent or hexavalent metal oxide to a level more than necessary. From this standpoint, it is also possible to suppress the decrease in sinterability, and low-temperature firing can be performed.

Furthermore, the present invention does not exclude the case where the composition of piezoelectric ceramic layers is arranged so that the donor content is in excess. That is, even in the case where the composition of piezoelectric ceramic layers is arranged so that the donor content is in excess, by applying the present invention, it is possible to compensate for the decrease in the average valence due to the diffusion of Cu without setting the donor content to be markedly in excess.

The external electrodes 31 and 32 are composed of Cu, an Ag—Pd alloy, or the like, and are formed on the surface of the body 10 by baking or the like.

A method for manufacturing the multilayer piezoelectric device will now be described.

First, starting materials, such as $Pb_3O_4$, $TiO_2$, $ZrO_2$, and according to need, NiO, ZnO, $Nb_2O_5$, etc., are prepared and mixed at a predetermined ratio. The resulting mixture is pulverized, and then calcined to obtain calcined powder of a piezoelectric ceramic. The calcined powder is kneaded with a binder and a plasticizer, and piezoelectric ceramic green sheets are formed by a doctor blade process.

Furthermore, a conductive paste for internal electrodes is prepared, the conductive paste containing Cu powder, a metal oxide containing a pentavalent or hexavalent metal element, specifically, for example, at least one of $Nb_2O_5$, $Sb_2O_5$, $Ta_2O_5$, and $WO_3$, and according to need, Ni powder. When Ni powder is incorporated in the conductive paste, the ratio of Cu powder content to Ni powder content, in terms of weight, is preferably set at 70:30 to 85:15. Furthermore, preferably, the content of the metal oxide is set to be less than 40.0% by weight on the basis of the total content of the conductive powder and the metal oxide (hereinafter, both of these are referred to as the "total solid"). The reason for this is that if the content of the metal oxide exceeds 40.0% by weight on the basis of the total solid content, the Cu content in the internal electrode layers 21 and 22 decreases, and therefore, there is a possibility that poor connection may occur between the internal electrodes 21 and 22 and the external electrodes 31 and 32.

Next, the conductive paste is printed on the piezoelectric ceramic green sheets to form internal electrode patterns. Then, piezoelectric ceramic green sheets provided with the internal electrode patterns and blank piezoelectric ceramic green sheets not provided with the internal electrode patterns are stacked in a predetermined order to form a laminate.

Next, the laminate is subjected to a firing process at a firing temperature of 950° C. to 1,000° C. for about 5 to 10 hours to form a body 10. From the standpoint that the oxidation of Cu which is the major component of the internal electrode layers 21 and 22 is inhibited and the reduction of Pb which is contained in the piezoelectric ceramic layers 11 is inhibited, the firing atmosphere is preferably set to be an atmosphere having an oxygen partial pressure between the equilibrium partial oxygen pressure for Pb—PbO and the equilibrium partial oxygen pressure for Cu—CuO.

The pentavalent or hexavalent metal oxide contained in the internal electrode patterns diffuses into the piezoelectric ceramic layers 11 such that the concentration decreases with distance from the internal electrode layers 21 and 22 during the firing process. Thereby, the decrease in the average valence in the B site due to the diffusion of Cu from the internal electrode layers into the piezoelectric ceramic layers during the firing process is charge-compensated for, and it is possible to suppress the degradation of piezoelectric ceramic properties even if the B site is not set so that the donor content is in excess.

Next, by baking conductive paste containing Cu or an Ag—Pd alloy as the major component onto the surface of the resulting body, external electrodes are formed. Polarization is performed by applying a predetermined voltage to the body in an oil, and thereby a multilayer piezoelectric device is fabricated.

In this embodiment, as described above, since the metal oxide is diffused from the internal electrode layers 21 and 22 into the piezoelectric ceramic layers 11, it is not necessary to set the composition of the piezoelectric ceramic layers 11 so that the donor content is in excess, and low-temperature firing can be performed.

The present invention is not limited to the embodiment described above. In the embodiment described above, the metal oxide containing a pentavalent or hexavalent metal is incorporated in the internal electrode patterns. As long as the metal element is distributed in the form of the metal oxide in the piezoelectric ceramic layers 11, the metal element is not necessarily contained in the form of the metal oxide in the internal electrode patterns. That is, in the internal electrode patterns, the metal element may be contained, for example, as an elemental metal, or as a compound, such as a carbonate, a hydroxide, or an organic compound. Furthermore, when a pentavalent or hexavalent metal is incorporated in a form other than the metal oxide in the conductive paste for internal electrodes, the amount of addition is preferably set to be less than 40.0% by weight in terms of the metal oxide.

Furthermore, in the present invention, it is possible to obtain a sufficient piezoelectric constant by low-temperature firing without setting the composition of the B site of the piezoelectric ceramic so that the donor content is in excess. However, the present invention does not exclude the case where the composition of the B site is set so that the donor content is in excess. It is acceptable to set the donor content to be in excess within a range that does not affect the characteristics and does not decrease sinterability.

Furthermore, the metal oxide that diffuses from the internal electrode layers into the piezoelectric ceramic layers may be present in grain boundaries or at crystal triple points in the piezoelectric ceramic layers, or may form solid solutions with the compound oxide having the perovskite structure and may be present in crystal grains in the piezoelectric ceramic layers.

Examples of the present invention will be specifically described below.

EXAMPLE 1

First, as starting materials for a piezoelectric ceramic, $Pb_3O_4$, $TiO_2$, $ZiO_2$, NiO, ZnO, and $Nb_2O_5$ powders are prepared and weighed so as to satisfy the composition shown in compositional formula (1) below.

$$Pb\{(Ni_{1/3}Nb_{2/3})_{0.1}(Zn_{1/3}Nb_{2/3})_{0.1}Ti_{0.42}Zr_{0.38}\}O_3 \qquad (1)$$

The weighed starting materials were mixed and pulverized for 16 hours, and then calcined at 880° C. to obtain calcined powder of the piezoelectric ceramic. The calcined powder was kneaded with a binder and a plasticizer, and piezoelectric ceramic green sheets with a thickness of 120 μm were obtained by a doctor blade process.

Next, as conductive powders, a Cu powder and a Ni powder were prepared, and as a metal oxide containing a pentavalent metal element, $Nb_2O_5$ was prepared.

Then, the Cu powder, the Ni powder, and $Nb_2O_5$ were weighed so that the ratio of the Cu powder content to the Ni powder content, in terms of weight, was 85:15 and the $Nb_2O_5$ content was 0% to 40% by weight on the basis of the total solid content ($Nb_2O_5$, Cu powder, and Ni powder). A binder, etc. was added to the weighed materials, and the mixture was kneaded in an organic vehicle to form a conductive paste for internal electrodes.

Next, the conductive paste was screen-printed on the piezoelectric ceramic green sheets to form internal electrode patterns. Then, piezoelectric ceramic green sheets provided with the internal electrode patterns and blank piezoelectric ceramic green sheets not provided with the internal electrode patterns were stacked in a predetermined order, followed by pressure bonding using a press. Thereby, a laminate including 80 internal electrode pattern layers was formed.

The laminate was subjected to a debinding process, and then firing was performed for 5 hours in an atmosphere having an oxygen partial pressure between the equilibrium partial oxygen pressure for Pb—PbO and the equilibrium partial oxygen pressure for Cu—CuO to form a body. The firing temperature was set at 950° C., 975° C., and 1,000° C., and a plurality of bodies were obtained.

Next, by baking a conductive paste for external electrodes containing Cu as a major component onto the surface of each body, external electrodes were formed. Then, polarization was performed in a silicone oil at 80° C. at an electric field intensity of 3 kV/mm, and thereby multilayer piezoelectric devices of Sample Nos. 1a to 9c were fabricated. The size of each multilayer piezoelectric device was 6 mm in length, 6 mm in width, and 8 mm in height.

Subsequently, an electric field with an intensity of 2 kV/mm was applied in the form of a triangular wave with a frequency of 0.1 kHz to each of the resulting samples. The distortion factor in the thickness direction was measured with an inductive probe and a differential transformer. The piezoelectric constant $d_{33}$ was calculated by dividing the distortion factor by the electric field.

Furthermore, with respect to each of samples of Sample Nos. 1b, 2b, and 5b, the contents (concentrations) of $Nb_2O_5$ and CuO were measured at four points in the piezoelectric ceramic layer at different distances from the internal electrode layer. That is, although the thickness of the piezoelectric ceramic green sheet was 120 μm as described above, the thickness of the piezoelectric ceramic layer was decreased to about 100 μm due to contraction during the firing process. With respect to four points in the piezoelectric ceramic, respectively, at distances of 3 μm, 6 μm, 20 μm, and 50 μm from the internal electrode layer, the concentrations (contents) of $Nb_2O_5$ and CuO were measured using a WDX (wavelength dispersive X-ray spectrometer).

Table 1 shows the $Nb_2O_5$ content on the basis of the total solid content in the internal electrode pattern, the firing temperature, and the piezoelectric constant $d_{33}$ in each sample, and Table 2 shows the concentrations of $Nb_2O_5$ and CuO at each measuring point in the piezoelectric ceramic layer.

Since the WDX cannot determine the oxidation numbers of atoms, there is a possibility that in some cases, Cu may be dispersed as $Cu_2O$. Consequently, strictly speaking, the CuO concentration in Table 2 shows the total of the CuO concentration and the $Cu_2O$ concentration.

TABLE 1

| Sample No. | $Nb_2O_5$ content (wt %) | Firing temperature (° C.) | Piezoelectric constant $d_{33}$ (pm/V) |
|---|---|---|---|
| 1a* | 0.0 | 1000 | 410 |
| 1b* | 0.0 | 975 | 430 |
| 1c* | 0.0 | 950 | 440 |
| 2a | 5.0 | 1000 | 530 |
| 2b | 5.0 | 975 | 550 |
| 2c | 5.0 | 950 | 565 |
| 3a | 10.0 | 1000 | 575 |
| 3b | 10.0 | 975 | 595 |
| 3c | 10.0 | 950 | 645 |
| 4a | 15.0 | 1000 | 620 |
| 4b | 15.0 | 975 | 655 |
| 4c | 15.0 | 950 | 695 |
| 5a | 20.0 | 1000 | 655 |
| 5b | 20.0 | 975 | 680 |
| 5c | 20.0 | 950 | 720 |
| 6a | 25.0 | 1000 | 675 |
| 6b | 25.0 | 975 | 715 |
| 6c | 25.0 | 950 | 725 |
| 7a | 30.0 | 1000 | 680 |
| 7b | 30.0 | 975 | 705 |
| 7c | 30.0 | 950 | 745 |
| 8a | 35.5 | 1000 | 680 |
| 8b | 35.5 | 975 | 725 |
| 8c | 35.5 | 950 | 750 |
| 9a | 40.0 | 1000 | — |
| 9b | 40.0 | 975 | — |
| 9c | 40.0 | 950 | — |

*Out of the range of the present invention

TABLE 2

| Sample No. | $Nb_2O_5$ content (wt %) | Distance from internal electrode layer (μm) | $Nb_2O_5$ concentration (wt %) | CuO concentration (wt %) |
|---|---|---|---|---|
| 1b* | 0 | 3 | 5.6 | 0.5 |
|  |  | 6 | 5.7 | 0.3 |
|  |  | 20 | 5.6 | 0.0 |
|  |  | 50 | 5.6 | 0.0 |
| 2b | 5 | 3 | 6.0 | 0.8 |
|  |  | 6 | 5.8 | 0.4 |
|  |  | 20 | 5.8 | 0.1 |
|  |  | 50 | 5.6 | 0.0 |
| 5b | 20 | 3 | 6.7 | 0.5 |
|  |  | 6 | 6.1 | 0.2 |
|  |  | 20 | 5.8 | 0.0 |
|  |  | 50 | 5.7 | 0.0 |

*Out of the range of the present invention

As is evident from Table 1, in Sample Nos. 1a to 1c, even if the firing temperature is varied, the piezoelectric constant $d_{33}$ is low at 410 to 440 pm/V.

In contrast, in Sample Nos. 2a to 8c, the piezoelectric constant $d_{33}$ is high at 530 to 750 pm/V, and it has been found that the piezoelectric constant $d_{33}$ improves compared with Sample Nos. 1a to 1c.

Furthermore, as is evident from Table 2, in Sample No. 1b, although the internal electrode pattern does not contain $Nb_2O_5$, since the piezoelectric ceramic composition contains the Nb component as shown in compositional formula (1), such a Nb component is substantially uniformly contained, as $Nb_2O_5$, in the piezoelectric ceramic layer.

In contrast, in Sample Nos. 2b and 5b, since $Nb_2O_5$ is also contained in the internal electrode pattern, $Nb_2O_5$ is diffused from the internal electrode layer into the piezoelectric layer during the firing process, and the concentration of $Nb_2O_5$ is distributed in the piezoelectric ceramic so as to be relatively high in the vicinity of the internal electrode layer and to decrease with distance from the internal electrode layer.

That is, Cu in the internal electrode pattern diffuses from the internal electrode layer into the piezoelectric ceramic layer during the firing process. In the case where the internal electrode pattern does not contain $Nb_2O_5$, since $Nb_2O_5$ does not diffuse from the internal electrode layer into the piezoelectric ceramic layer, due to the diffusion of Cu, it is not possible to improve the piezoelectric constant $d_{33}$.

In contrast, in the case where the internal electrode pattern contains $Nb_2O_5$, since $Nb_2O_5$ diffuses from the internal electrode layer into the piezoelectric ceramic layer as described above, the decrease in the average valence in the B site of the composition of the piezoelectric ceramic due to the diffusion of Cu is charge-compensated for by $Nb_2O_5$. Thereby, low-temperature firing is enabled, and a sufficient piezoelectric constant is ensured.

Furthermore, as is evident from comparison among samples a to c in each of Sample Nos. 2. to 8, as the firing temperature decreases, the piezoelectric constant $d_{33}$ increases, and at the firing temperature of 950° C., the better piezoelectric constant $d_{33}$ can be obtained.

However, with respect to Sample Nos. 9a to 9c, the $Nb_2O_5$ content on the basis of the total solid content in the internal electrode pattern is high at 40.0% by weight, and therefore, it is not possible to obtain the piezoelectric constant $d_{33}$. The reason for this is that since the Cu content decreases as the $Nb_2O_5$ content increases excessively, poor connection occurs between the external electrodes and the internal electrode layers. Consequently, it has been found that in the case of a multilayer piezoelectric device having a structure as that in this example, the $Nb_2O_5$ content on the basis of the total solid content is preferably less than 40.0% by weight.

Figure 2:
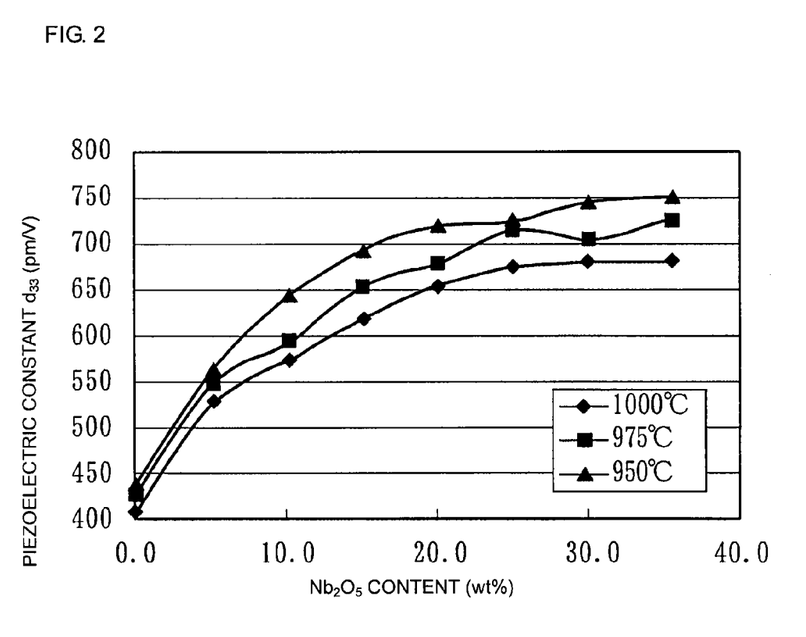
FIG. 2 is a graph showing the relationship between the Nb$_2$O$_5$ content in internal electrode patterns and the piezoelectric constant d$_{33}$.

Furthermore, FIG. 2 is a graph showing the relationship between the $Nb_2O_5$ content and the piezoelectric constant $d_{33}$. The abscissa axis represents the $Nb_2O_5$ content (wt %), and the ordinate axis represents the piezoelectric constant $d_{33}$ (pm/V). The solid diamond represents the firing temperature of 1,000° C., the solid square represents the firing temperature of 975° C., and the solid triangle represents the firing temperature of 950° C.

As is evident from Table 1 and FIG. 2, it has been confirmed that as the $Nb_2O_5$ content increases and as the firing temperature decreases, the piezoelectric constant $d_{33}$ tends to increase.

EXAMPLE 2

Multilayer piezoelectric devices of Sample Nos. 11a to 19c were fabricated by the same method and procedure as in [Example 1] except that $WO_3$ containing a hexavalent metal element was used, instead of $Nb_2O_5$, as the metal oxide incorporated in the internal electrode pattern.

Next, with respect to Sample Nos. 11a to 19c, the piezoelectric constant $d_{33}$ was calculated by the same method and procedure as in [Example 1]. Furthermore, with respect to the samples in each of Sample Nos. 11b, 12b, and 15b, the concentrations (contents) of $WO_3$ and CuO were measured using a WDX (wavelength dispersive X-ray spectrometer).

Table 3 shows the $WO_3$ content on the basis of the total solid content in the internal electrode pattern, the firing temperature, and the piezoelectric constant $d_{33}$ in each sample, and Table 4 shows the concentrations of $WO_3$ and CuO at each measuring point in the piezoelectric ceramic layer.

TABLE 3

| Sample No. | $WO_3$ content (wt %) | Firing temperature (° C.) | Piezoelectric constant $d_{33}$ (pm/V) |
|---|---|---|---|
| 11a* | 0.0 | 1000 | 410 |
| 11b* | 0.0 | 975 | 430 |
| 11c* | 0.0 | 950 | 440 |
| 12a | 5.0 | 1000 | 460 |
| 12b | 5.0 | 975 | 490 |
| 12c | 5.0 | 950 | 565 |
| 13a | 10.0 | 1000 | 520 |
| 13b | 10.0 | 975 | 555 |
| 13c | 10.0 | 950 | 610 |
| 14a | 15.0 | 1000 | 555 |
| 14b | 15.0 | 975 | 595 |
| 14c | 15.0 | 950 | 680 |
| 15a | 20.0 | 1000 | 595 |
| 15b | 20.0 | 975 | 630 |
| 15c | 20.0 | 950 | 715 |
| 16a | 25.0 | 1000 | 640 |
| 16b | 25.0 | 975 | 700 |
| 16c | 25.0 | 950 | 750 |
| 17a | 30.0 | 1000 | 675 |
| 17b | 30.0 | 975 | 745 |
| 17c | 30.0 | 950 | 745 |
| 18a | 35.5 | 1000 | 680 |
| 18b | 35.5 | 975 | 735 |
| 18c | 35.5 | 950 | 765 |
| 19a | 40.0 | 1000 | — |
| 19b | 40.0 | 975 | — |
| 19c | 40.0 | 950 | — |

*Out of the range of the present invention

TABLE 4

| Sample No. | $WO_3$ content (wt %) | Distance from internal electrode layer (μm) | $WO_3$ concentration (wt %) | CuO concentration (wt %) |
|---|---|---|---|---|
| 11b* | 0 | 3 | 0.0 | 0.5 |
| | | 6 | 0.0 | 0.3 |
| | | 20 | 0.0 | 0.0 |
| | | 50 | 0.0 | 0.0 |
| 12b | 5 | 3 | 0.2 | 0.5 |
| | | 6 | 0.1 | 0.2 |
| | | 20 | 0.1 | 0.0 |
| | | 50 | 0.1 | 0.0 |
| 15b | 20 | 3 | 0.6 | 0.7 |
| | | 6 | 0.5 | 0.4 |
| | | 20 | 0.4 | 0.0 |
| | | 50 | 0.4 | 0.0 |

*Out of the range of the present invention

As is evident from Table 3, in Sample Nos. 11a to 11c, even if the firing temperature is varied, the piezoelectric constant $d_{33}$ is low at 410 to 440 pm/V.

In contrast, in Sample Nos. 12a to 18c, the piezoelectric constant $d_{33}$ is high at 460 to 765 pm/V, and it has been found that the piezoelectric constant $d_{33}$ improves compared with Sample Nos. 11a to 11c.

Furthermore, as is evident from Table 4, in Sample No. 11b, since the piezoelectric ceramic does not contain $WO_3$ (refer to compositional formula (1)) and since the internal electrode pattern also does not contain $WO_3$, no $WO_3$ is detected.

In contrast, in Sample Nos. 12b and 15b, since $WO_3$ is contained in the internal electrode pattern, $WO_3$ is diffused from the internal electrode layer into the piezoelectric layer during the firing process, and the concentration of $WO_3$ is distributed in the piezoelectric ceramic so as to be relatively high in the vicinity of the internal electrode layer and to decrease with distance from the internal electrode layer.

That is, Cu in the internal electrode pattern diffuses from the internal electrode layer into the piezoelectric ceramic layer during the firing process. In the case where the internal electrode pattern does not contain $WO_3$, since $WO_3$ does not diffuse from the internal electrode layer into the piezoelectric ceramic layer, due to the diffusion of Cu, it is not possible to improve the piezoelectric constant $d_{33}$.

In contrast, in the case where the internal electrode pattern contains $WO_3$, since $WO_3$ diffuses from the internal electrode layer into the piezoelectric ceramic layer as described above, the decrease in the average valence in the B site of the composition of the piezoelectric ceramic due to the diffusion of Cu is charge-compensated for by $WO_3$. Thereby, low-temperature firing is enabled, and a sufficient piezoelectric constant is ensured.

Furthermore, as is evident from comparison among samples a to c in each of Sample Nos. 12 to 18, as in [Example 1], as the firing temperature decreases, the piezoelectric constant $d_{33}$ increases, and at the firing temperature of 950° C., the better piezoelectric constant $d_{33}$ can be obtained.

However, with respect to Sample Nos. 19a to 19c, the $WO_3$ content on the basis of the total solid content in the internal electrode pattern is high at 40.0% by weight, and therefore, it is not possible to obtain the piezoelectric constant $d_{33}$ for the same reason as described in [Example 1] with respect to Sample Nos. 9a to 9c.

Figure 3:
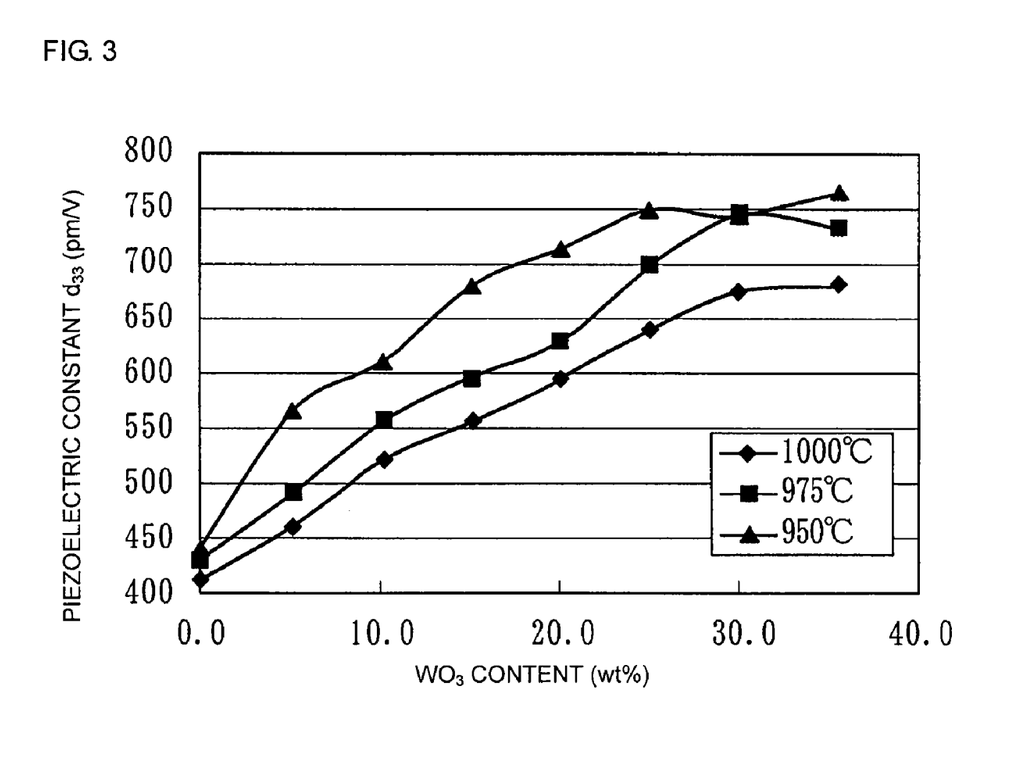
FIG. 3 is a graph showing the relationship between the WO$_3$ content in internal electrode patterns and the piezoelectric constant d$_{33}$.

Furthermore, FIG. 3 is a graph showing the relationship between the $WO_3$ content and the piezoelectric constant $d_{33}$. The abscissa axis represents the $WO_3$ content (wt %), and the ordinate axis represents the piezoelectric constant $d_{33}$ (pm/V). The solid diamond represents the firing temperature of 1,000° C., the solid square represents the firing temperature of 975° C., and the solid triangle represents the firing temperature of 950° C.

As is evident from Table 3 and FIG. 3, it has been confirmed that as the $WO_3$ content increases and as the firing temperature decreases, the piezoelectric constant $d_{33}$ tends to increase.

What is claimed is:

1. A multilayer piezoelectric device comprising:
a body having alternately stacked internal electrode layers and piezoelectric ceramic layers,
wherein the internal electrode layers contain Cu as a major component,
the piezoelectric ceramic layers contain a compound oxide represented by Pb(Ti, Zr)O3 as a major component, and
a metal oxide containing at least one of a pentavalent metal element and a hexavalent metal element is incorporated in the piezoelectric ceramic layers such that the concentration of the metal oxide decreases with distance from the internal electrode layers.

2. The multilayer piezoelectric device according to claim 1, wherein the metal element is at least one element selected from the group consisting of Nb, Sb, Ta, and W.

3. The multilayer piezoelectric device according to claim 1, wherein the Cu in the internal electrode layers is in a conductive powder.

4. The multilayer piezoelectric device according to claim 3, wherein the conductive powder contains Ni as a minor component.

5. The multilayer piezoelectric device according to claim 4, wherein the ratio of Cu to Ni, in weight percent, is in the range of 85:15 to 70:30.

6. The multilayer piezoelectric device according to claim 1, wherein the internal electrode layers further contain a metal oxide containing at least one of a pentavalent metal element and a hexavalent metal element.

7. The multilayer piezoelectric device according to claim 1, further comprising external electrode layers disposed on a surface of the body.

8. The multilayer piezoelectric device according to claim 7, wherein the internal electrode layers are alternately connected to respective external electrode layers.

9. The multilayer piezoelectric device according to claim 7, wherein the external electrodes are formed from one of Cu and an Ag—Pd alloy.

* * * * *